(12) United States Patent
Morita

(10) Patent No.: US 10,811,224 B2
(45) Date of Patent: Oct. 20, 2020

(54) MULTI-CHARGED-PARTICLE BEAM WRITING APPARATUS

(71) Applicant: NuFlare Technology, Inc., Yokohama-shi (JP)

(72) Inventor: Hirofumi Morita, Setagaya-ku (JP)

(73) Assignee: NuFlare Technology, Inc., Yokohama-shi (JP)

( * ) Notice: Subject to any disclaimer, the term of this patent is extended or adjusted under 35 U.S.C. 154(b) by 54 days.

(21) Appl. No.: 16/142,200

(22) Filed: Sep. 26, 2018

(65) Prior Publication Data

US 2019/0122856 A1 Apr. 25, 2019

(30) Foreign Application Priority Data

Oct. 25, 2017 (JP) ................................ 2017-206280

(51) Int. Cl.
*H01J 37/30* (2006.01)
*H01J 37/04* (2006.01)
*H01J 37/317* (2006.01)

(52) U.S. Cl.
CPC ........ *H01J 37/3007* (2013.01); *H01J 37/045* (2013.01); *H01J 37/3177* (2013.01);
(Continued)

(58) Field of Classification Search
CPC .. H01J 37/3007; H01J 37/3177; H01J 37/045; H01J 2237/303; H01J 2237/0435;
(Continued)

(56) References Cited

U.S. PATENT DOCUMENTS

| 7,781,748 B2 | 8/2010 | Platzgummer |
| 2008/0054196 A1* | 3/2008 | Hiroshima ............. B82Y 10/00 250/492.23 |

(Continued)

FOREIGN PATENT DOCUMENTS

| JP | 9-232209 | 9/1997 |
| JP | 2006-140267 | 6/2006 |

(Continued)

OTHER PUBLICATIONS

Korean Office Action dated Oct. 31, 2019 in Korean Patent Application No. 10-2018-0121060 (with unedited computer generated English translation), citing documents AO and AP therein, 9 pages.

(Continued)

*Primary Examiner* — Brooke Purinton
(74) *Attorney, Agent, or Firm* — Oblon, McClelland, Maier & Neustadt, L.L.P.

(57) ABSTRACT

In one embodiment, a multi-charged-particle beam writing apparatus includes an emission unit emitting a charged-particle beam, a limiting aperture substrate including a single first aperture, a shaping aperture array that has a plurality of second apertures and that is irradiated with the charged-particle beam having passed through the first aperture in a region including the plurality of second apertures and forms multi-beams by letting part of the charged-particle beam pass through the plurality of second apertures, and a blanking aperture array member including a plurality of third apertures through each of which a corresponding one of the multi-beams that have passed through the plurality of second apertures passes, the blanking aperture array member having a blanker in each of the third apertures, the blanker performing blanking deflection on the corresponding beam.

7 Claims, 6 Drawing Sheets

(52) U.S. Cl.
CPC ... *H01J 37/3174* (2013.01); *H01J 2237/0435* (2013.01); *H01J 2237/12* (2013.01); *H01J 2237/14* (2013.01); *H01J 2237/20228* (2013.01); *H01J 2237/303* (2013.01)

(58) Field of Classification Search
CPC .............. H01J 2237/14; H01J 2237/12; H01J 2237/20228; H01J 37/3174
See application file for complete search history.

(56) References Cited

U.S. PATENT DOCUMENTS

| | | | | |
|---|---|---|---|---|
| 2015/0037731 | A1* | 2/2015 | Sano | H01J 37/3177 430/126.2 |
| 2015/0243480 | A1* | 8/2015 | Yamada | H01J 37/3045 250/492.22 |
| 2015/0255249 | A1* | 9/2015 | Ogasawara | H01J 37/3177 250/396 R |
| 2016/0071692 | A1 | 3/2016 | Ogasawara | |

FOREIGN PATENT DOCUMENTS

| | | |
|---|---|---|
| JP | 2013-128031 A | 6/2013 |
| JP | 2013-161733 | 8/2013 |
| JP | 2016-134486 A | 7/2016 |
| TW | 201719291 A | 6/2017 |
| TW | 201732445 A | 9/2017 |

OTHER PUBLICATIONS

Taiwanese Office Action dated Jan. 9, 2020 in Taiwanese Patent Application No. 107135115 (with unedited computer generated English translation). citing documents AA. AO, and AP therein, 9 pages.

Office Action dated Jul. 1. 2020, in Chinese Patent Application No. 201811250817.9 w/English Machine Translation.

* cited by examiner

MULTI-CHARGED-PARTICLE BEAM WRITING APPARATUS

CROSS REFERENCE TO RELATED APPLICATION

This application is based upon and claims benefit of priority from the Japanese Patent Application No. 2017-206280, filed on Oct. 25, 2017, the entire contents of which are incorporated herein by reference.

FIELD

The present invention relates to a multi-charged-particle beam writing apparatus.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

A writing apparatus using multiple beams enables irradiation with many beams at a time as compared with writing with a single electron beam, and thus markedly increases throughput. A multi-beam writing apparatus that uses a blanking aperture array, as one mode of multi-beam writing apparatuses, forms multi-beams (a plurality of electron beams) by, for example, causing an electron beam emitted from one electron gun to pass through a shaping aperture array that has a plurality of apertures. The multi-beams pass through the inside of blankers corresponding thereto of the blanking aperture array.

The blanking aperture array includes a pair of electrodes for deflecting beams individually and beam passage apertures therebetween, and performs blanking deflection of each of passing electron beams individually by fixing one of the pair of electrodes (blankers) at a ground potential and switching the other electrode between the ground potential and another potential. The electron beams that have been deflected by the blankers are blocked, and the electron beams that have not been deflected are applied onto a specimen (a mask).

Due to the beam irradiation, the temperature of the shaping aperture array is increased, and an aperture pitch changes as a result of thermal expansion. When the aperture pitch of the shaping aperture array changes, the beam pitch of the multi-beams changes, and some beams do not pass through the apertures of the blanking aperture array, which causes a problem in which a portion of a beam array that should be imaged on a surface of the specimen is lost.

As a means for suppressing the temperature rise of the shaping aperture array, it is conceivable to improve the heat dissipation of a holding mechanism of the shaping aperture array. However, it is not possible to sufficiently suppress the temperature rise of the shaping aperture array because irradiation of electron beams is required to be performed in vacuum, and thus, the shaping aperture array and the holding mechanism thereof are arranged in vacuum.

DETAILED DESCRIPTION

In one embodiment, a multi-charged-particle beam writing apparatus includes an emission unit emitting a charged-particle beam, a limiting aperture substrate including a single first aperture, a shaping aperture array that has a plurality of second apertures and that is irradiated with the charged-particle beam having passed through the first aperture in a region including the plurality of second apertures and forms multi-beams by letting part of the charged-particle beam pass through the plurality of second apertures, and a blanking aperture array member including a plurality of third apertures through each of which a corresponding one of the multi-beams that have passed through the plurality of second apertures passes, the blanking aperture array member having a blanker in each of the third apertures, the blanker performing blanking deflection on the corresponding beam.

An embodiment of the present invention will be described below with reference to the drawings. In the embodiment, a configuration using an electron beam as an example of a charged particle beam will be described. The charged particle beam is not limited to the electron beam. For example, the charged particle beam may be an ion beam.

First Embodiment

Figure 1:
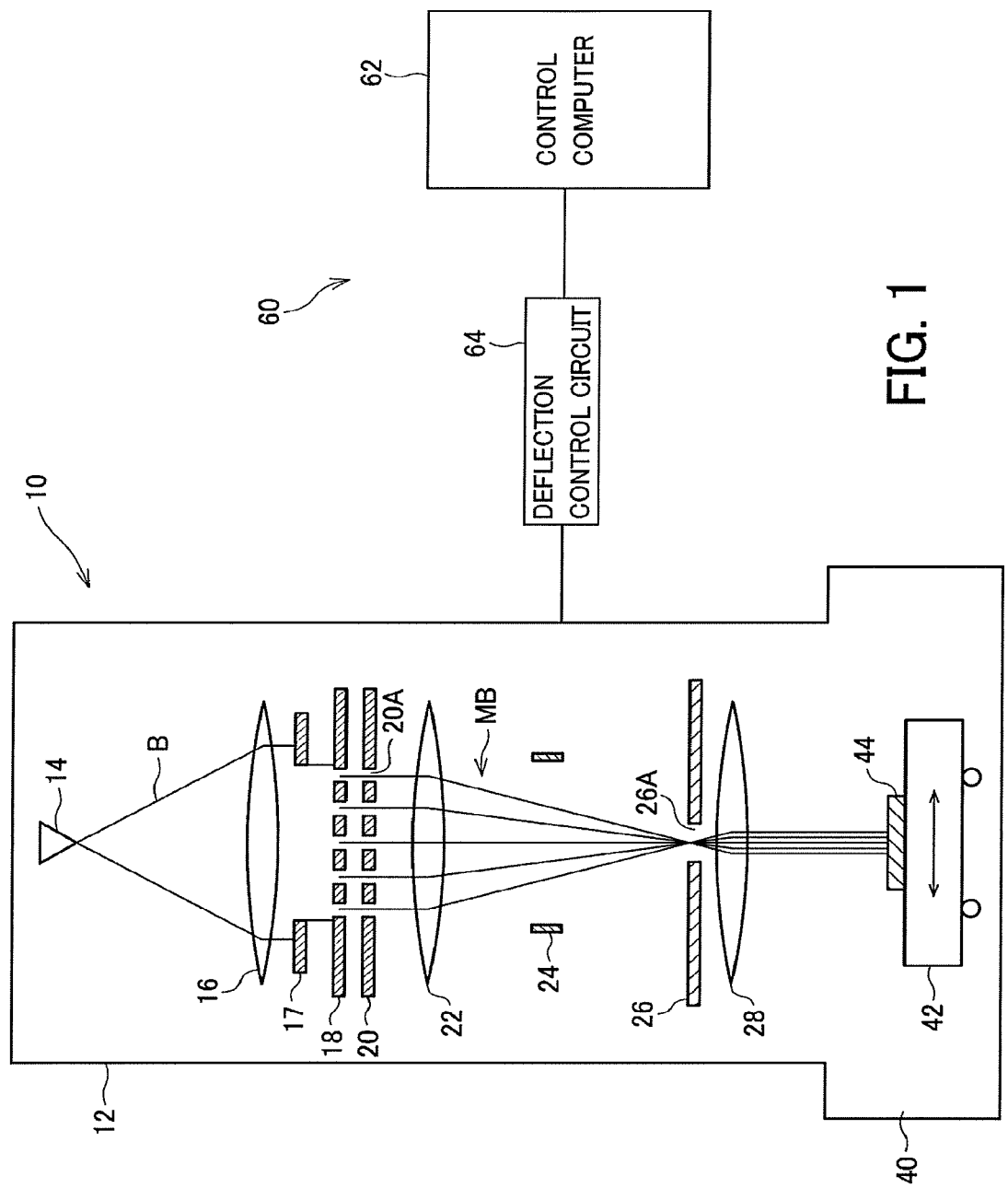
FIG. 1 is a schematic view of a multi-charged-particle beam writing apparatus according to a first embodiment of the present invention.

A writing apparatus illustrated in FIG. 1 includes a writing unit 10 that writes a desired pattern by irradiating an object such as a mask or a wafer with an electron beam; and a controlling unit 60 that controls the operation of the writing unit 10. The writing unit 10, as an example of a multi-beam writing apparatus, includes an electron beam column 12 and a writing chamber 40.

An electron gun 14, an illumination lens 16, a limiting aperture 17 (limiting aperture substrate), a shaping aperture array 18, a blanking aperture array 20, a projection lens 22, a deflector 24, a stopping aperture 26, and an objective lens 28 are arranged inside the electron beam column 12.

An XY stage 42 is arranged inside the writing chamber 40. A mask blank, which is a substrate 44 for writing, is placed on the XY stage 42.

Figure 2:
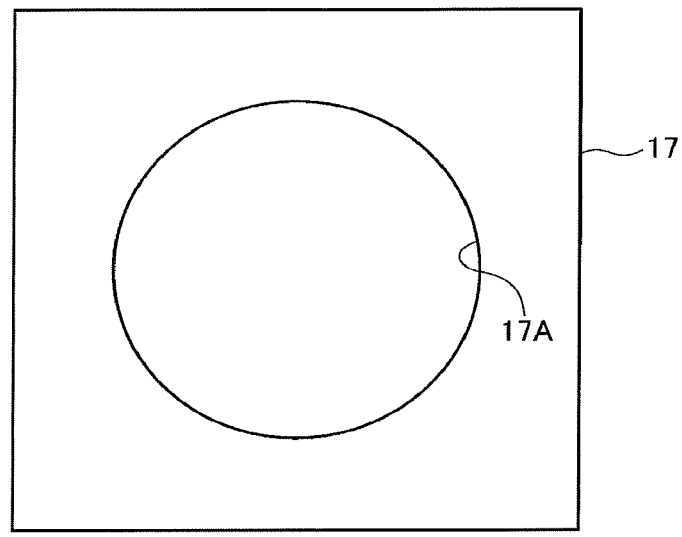
FIG. 2 is a plan view of a limiting aperture.

As illustrated in FIG. 2, a single aperture 17A (first aperture) is formed in the limiting aperture 17. The aperture 17A has, for example, a circular shape. The limiting aperture 17 is arranged on the upstream side of the shaping aperture array 18 in a beam travel direction and reduces a beam irradiation amount with respect to the shaping aperture array 18 by blocking a portion of the beam.

An easily processable material, such as silicon, carbon, aluminum, titanium, or the like, having a small electron reflectance (backscattering coefficient) is preferably used for the limiting aperture 17 to suppress scattering of electrons.

Figure 3:
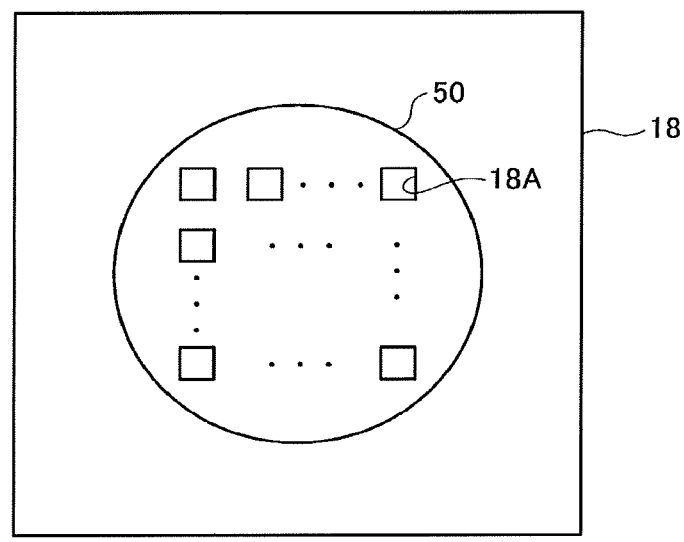
FIG. 3 is a plan view of a shaping aperture array, illustrating a beam irradiation region in the shaping aperture array.

As illustrated in FIG. 3, apertures 18A (second apertures) of m columns×n rows (m, n≥2) are formed at a predetermined array pitch in the shaping aperture array 18. The apertures 18A are each formed to have an identical rectangular shape of identical dimensions. The shape of the apertures 18A may also be circular.

When the number of the apertures 18A in the vertical direction and the number of the apertures 18A in the horizontal direction are equal to each other (when m=n), the shape of the arrangement region of the apertures 18A is square.

An irradiation region 50 (aperture image) in which an electron beam B that is shaped into a circular shape by passing through the aperture 17A of the limiting aperture 17 is irradiated onto the shaping aperture array 18 is slightly larger than the arrangement region of the apertures 18A.

A portion of the electron beam passes through each of the plurality of apertures 18A, and thereby, multi-beams MB are formed.

The blanking aperture array 20 is arranged below (on the downstream side in an optical path) the shaping aperture array 18 and includes passage holes 20A (third apertures) corresponding to the respective apertures 18A of the shaping aperture array 18. A blanker (not illustrated) that is constituted by a pair of electrodes is arranged in each of the passage holes 20A. One of the electrodes of the blanker is fixed at a ground potential, and the other electrode is switched between the ground potential and another potential.

The electron beams that pass through the respective passage holes 20A are deflected independently by a voltage applied to the blankers. Thus, the plurality of blankers perform blanking deflection of corresponding beams among the multi-beams MB that have passed through the plurality of apertures 18A of the shaping aperture array 18.

The stopping aperture 26 blocks the beams that have been deflected by the blankers. The beams that have not been deflected by the blankers pass through an aperture 26A formed in a center portion of the stopping aperture 26. The stopping aperture 26 is arranged on an image plane of a crossover (light-source image), in which diverging of the beams becomes small, to reduce leakage of the beams during individual blanking by the blanking aperture array 20.

The controlling unit 60 includes a control computer 62, a deflection control circuit 64, and the like. The deflection control circuit 64 is connected to the blanking aperture array 20 and the deflector 24. The control computer 62 retrieves writing data from a storage device (not illustrated) and generates apparatus-specific shot data by performing a plurality of steps of data conversion processing. In the shot data, the irradiation amount of each shot, an irradiation position coordinate, and the like are defined.

The control computer 62 outputs the irradiation amount of each shot to the deflection control circuit 64 on the basis of the shot data. The deflection control circuit 64 obtains an irradiation period t by dividing the input irradiation amount by a current density. Meanwhile, when a corresponding shot is performed, the deflection control circuit 64 applies a deflection voltage to the corresponding blanker of the blanking aperture array 20 so that the blanker turns the beam on for the irradiation period t.

In addition, the control computer 62 outputs deflection position data to the deflection control circuit 64 so that each beam is deflected to a position (coordinate) indicated by the shot data. The deflection control circuit 64 calculates a deflection amount and applies the deflection voltage to the deflector 24. Consequently, the multi-beams MB that are to be shot at the time are collectively deflected.

The electron beam B emitted from the electron gun 14 (emission unit) is caused by the illumination lens 16 to illuminate the limiting aperture 17 substantially vertically. The electron beam that has passed through the aperture 17A of the limiting aperture 17 illuminates the aperture arrangement region of the shaping aperture array 18. The electron beam passes through the plurality of apertures 18A of the shaping aperture array 18, and thereby, a plurality of electron beams (multi-beams) MB are formed. The multi-beams MB pass through the inside of the blankers corresponding thereto of the blanking aperture array 20.

The multi-beams MB that have passed through the blanking aperture array 20 are reduced in size by the projection lens 22 and travel toward the aperture 26A at the center of the stopping aperture 26. Here, the electron beams that have been deflected by the blankers of the blanking aperture array 20 are displaced from the aperture 26A of the stopping aperture 26 and blocked by the stopping aperture 26. Meanwhile, the electron beams that have not been deflected by the blankers pass through the aperture 26A of the stopping aperture 26. Blanking is controlled by on/off of the blankers, and the on/off of the beams is thereby controlled.

Thus, the stopping aperture 26 blocks each of the beams deflected by the blankers of the blanking aperture array 20 so as to enter an off state. Beams passing through the stopping aperture member 26 during the period from "beam-on" to "beam-off" are equivalent to a single shot.

The multi-beams MB that have passed through the stopping aperture 26 are focused on the substrate 44 by the objective lens 28 and becomes a pattern image having a desired reduction ratio. The beams (whole multi-beams) that have passed through the stopping aperture 26 are collectively deflected in an identical direction by the deflector 24 and irradiated at respective irradiation positions of the beams on the substrate 44.

Note that, in the example in FIG. 1, the deflector 24 is arranged on the upstream side of the stopping aperture 26 in the optical path; however, the deflector 24 may be arranged on the downstream side.

When the XY stage 42 is continuously moved, the beam irradiation positions are controlled by the deflector 24 so as to follow the movement of the XY stage 42. The XY stage 42 is moved by a stage controlling unit, which is not illustrated.

In the present embodiment, the limiting aperture 17 is provided above (on the upstream side of the shaping aperture array 18 in the optical path) the shaping aperture array 18 to reduce the beam irradiation amount with respect to the shaping aperture array 18. Therefore, it is possible to suppress the temperature rise of the shaping aperture array 18 and to prevent a change in the aperture pitch of the apertures 18A.

A portion of the electron beam emitted from the electron gun 14 is blocked by the limiting aperture 17, and as a result, a region that gradually becomes darker (the irradiation amount is reduced) toward the outside is generated at the peripheral portion of the beam irradiation region 50 of the shaping aperture array 18. When such an irradiation amount reduction region (hereinafter also referred to as "penumbra blur") and the apertures 18A overlap each other, beams that have low-current density are formed. In order to prevent low-current density beams from being formed, a margin of a distance more than the penumbra blur is required for a gap between the apertures at the outer most periphery and the shadow of the limiting aperture; thus, it is preferable to reduce the penumbra blur to narrow the irradiation region to the limit so that the beam irradiation amount is reduced as much as possible.

In order to sufficiently reduce the penumbra blur, preferably, a gap D between the shaping aperture array 18 and the limiting aperture 17 satisfies the following conditions. In the following conditional expression, a is a beam convergence angle on the substrate 44, M is an imaging magnification from the shaping aperture array 18 to a substrate surface, and P is an array pitch of the apertures 18A of the shaping aperture array 18.

$$D \leq P/(10 \cdot M \cdot \alpha)$$

It is possible to cause the penumbra blur to be equal to or less than $\frac{1}{10}$ the array pitch P by setting the gap D so as to satisfy the aforementioned conditional expression.

In order to reduce the beam irradiation amount with respect to the shaping aperture array 18, it is conceivable to arrange, above the shaping aperture array 18, a limiting aperture array in which a plurality of apertures corresponding to the apertures 18A are formed. However, when the apertures of the limiting aperture array and the apertures 18A of the shaping aperture array 18 are displaced from each other, a portion of the multi-beams are lost. To perform highly precise aligning between the apertures of the limiting aperture array and the apertures 18A of the shaping aperture array 18, it is required to provide a complex and expensive aligning mechanism.

In addition, when the limiting aperture array in which the plurality of apertures are formed is used, there is a possibility that the apertures are closed due to contamination because the dimensions of each of the apertures of the limiting aperture array are small. When the apertures are closed, a portion of the multi-beams is lost. In addition, even when the apertures are prevented from being closed, the distance between a contamination and the beams is small, the beams are thus deflected due to electric charging of the contamination, and the beam precision is remarkably degraded.

In contrast, in the present embodiment, the limiting aperture 17 that has the single aperture 17A having a large diameter is arranged. Therefore, there is no need to perform highly precise aligning with respect to the apertures 18A of the shaping aperture array 18. In addition, there is no (extremely low) possibility that the aperture 17A is closed; thus, even when a contamination is generated at the peripheral edge of the aperture 17A, a large gap is secured between the beam and the contamination, and it is possible to considerably reduce a beam deflection effect due to electric charging of the contamination.

Second Embodiment

Figure 4:
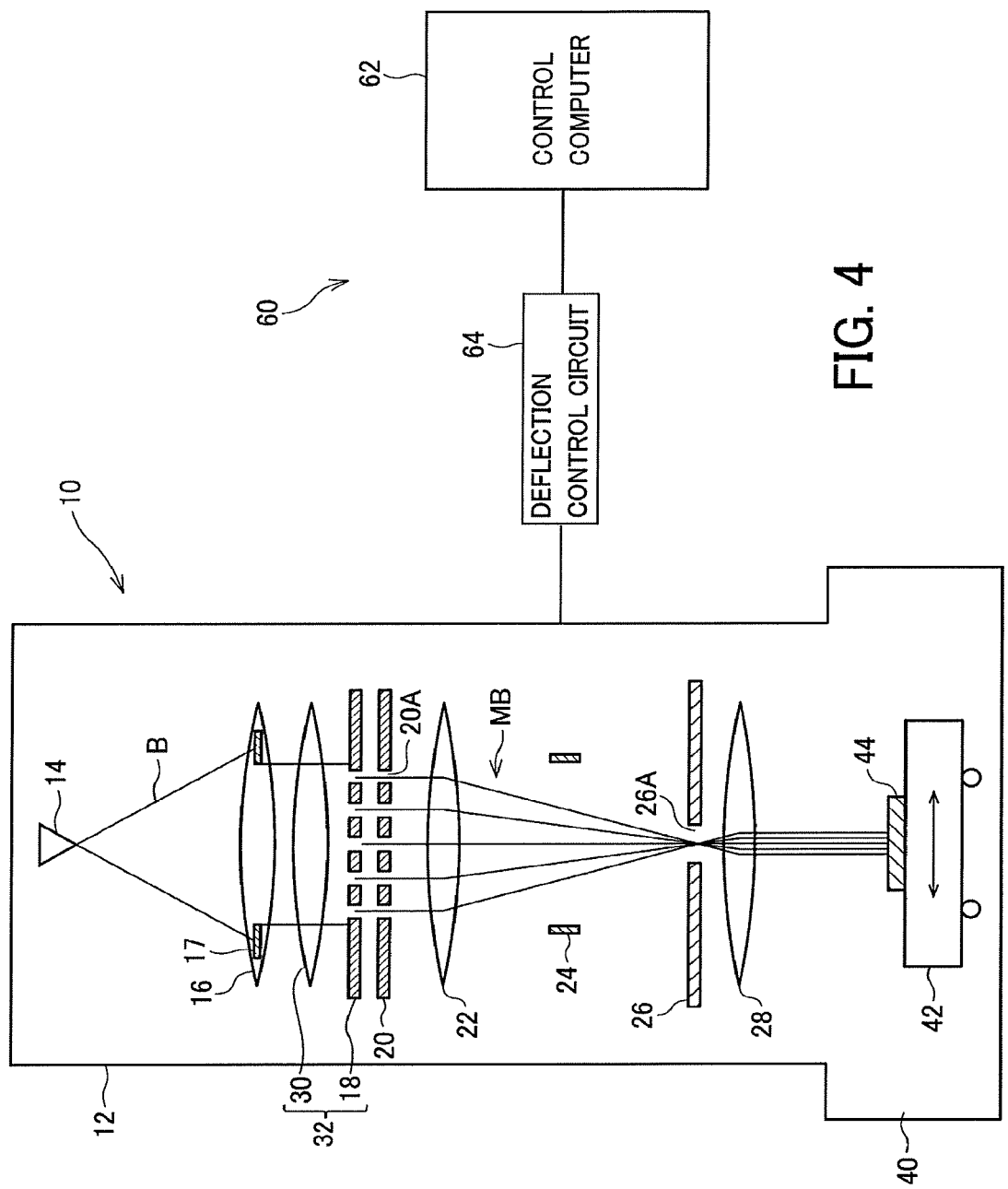
FIG. 4 is a schematic view of a multi-charged-particle beam writing apparatus according to a second embodiment.

FIG. 4 illustrates a general constitution of a writing apparatus according to a second embodiment. The present embodiment is different, compared with the first embodiment illustrated in FIG. 1, in that an electrostatic lens 30 is provided. In FIG. 4, portions identical to those in the first embodiment illustrated in FIG. 1 are given identical reference signs, and description thereof will be omitted.

The electrostatic lens 30 constitutes a grating lens 32 in which the shaping aperture array 18 is utilized as a grating. The grating lens 32 reduce an aberration of an illumination system to reduce the size of a light-source image on the stopping aperture 26. The electrostatic lens 30 is arranged between the illumination lens 16 and the shaping aperture array 18.

In order to prevent an electric field of the grating lens 32 from being disturbed, the limiting aperture 17 is arranged in the illumination lens 16 or above (on the upstream side in the optical path) the illumination lens 16. FIG. 4 illustrates an example in which the limiting aperture 17 is arranged in the illumination lens 16.

Even when the grating lens 32 is provided, it is possible to reduce the beam irradiation amount with respect to the shaping aperture array 18 and suppress the temperature rise of the shaping aperture array 18.

Third Embodiment

Figure 5A:
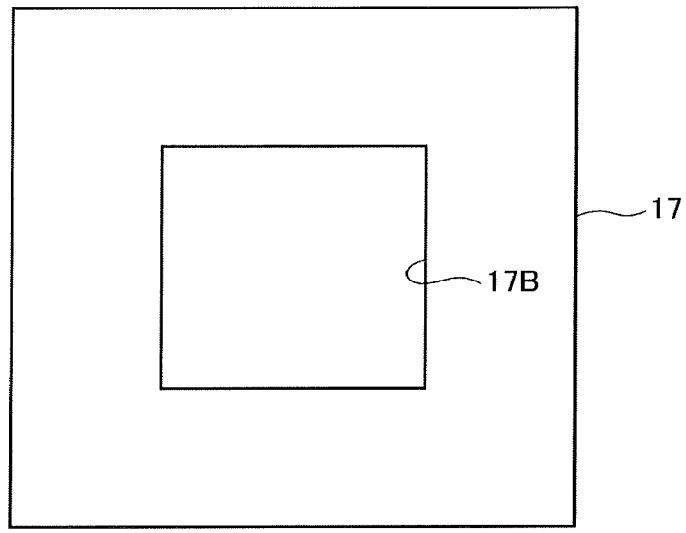
FIG. 5A is a plan view of a limiting aperture according to a third embodiment.
Figure 5B:
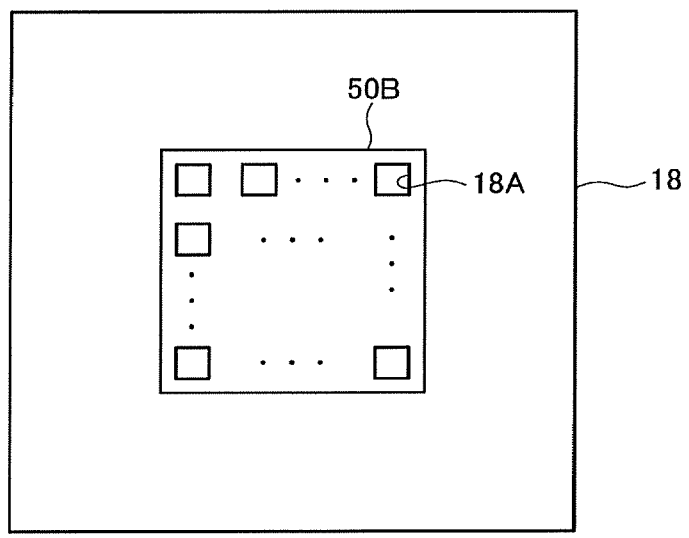
FIG. 5B illustrates a beam irradiation region in a shaping aperture array.

In the aforementioned first embodiment, an example in which the circular aperture 17A is formed in the limiting aperture 17, as illustrated in FIG. 2, has been described; however, an aperture 17B that has a rectangular shape may be formed, as illustrated in FIG. 5A. FIG. 5B illustrates a rectangular irradiation region 50B in which the electron beam that has passed through the aperture 17B of the limiting aperture 17 is irradiated onto the shaping aperture array 18.

The shape of the aperture 17B preferably corresponds to the shape of the arrangement region of the apertures 18A of the shaping aperture array 18. For example, when the shape of the arrangement region of the apertures 18A is square, the shape of the aperture 17B is also set to be square. Consequently, the irradiation region 50B also becomes a square shape.

When the diameter of the circular irradiation region 50 illustrated in FIG. 3 and the diagonal length of the square irradiation region 50B illustrated in FIG. 5B are set to be identical to each other, the present embodiment is capable of further reducing by approximately 36% the beam irradiation amount with respect to the shaping aperture array 18 compared with the aforementioned first embodiment. Therefore, it is possible to further effectively suppress the temperature rise of the shaping aperture array 18.

Fourth Embodiment

Figure 6:
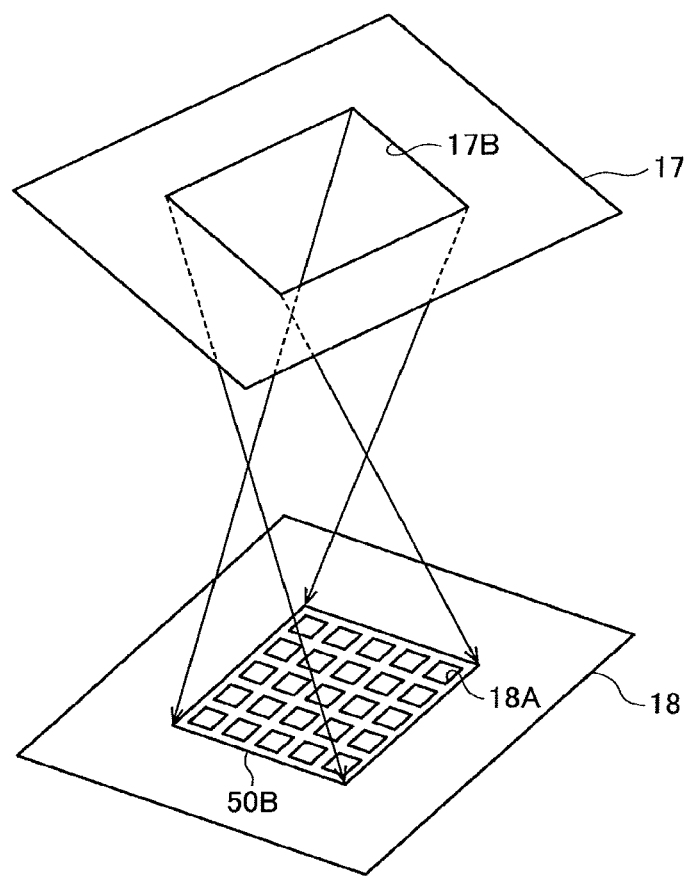
FIG. 6 illustrates an example of a beam that travels while turning.

In the aforementioned second embodiment illustrated in FIG. 4, the limiting aperture 17 in which the aperture 17B that has a rectangular shape is formed may be used. When the illumination lens 16 is a magnetic-field type, the beam that has passed through the aperture 17B and has been formed into a rectangular shape travels while turning in a magnetic field. Therefore, preferably, the limiting aperture 17 is rotated and arranged, as illustrated in FIG. 6, such that the position of the rectangular irradiation region 50B and the position of the arrangement region of the apertures 18A coincide with each other.

The rotation amount of the limiting aperture 17 is obtainable by previously calculating. The rotation amount may be determined by providing a rotation mechanism of the limiting aperture 17 and detecting beams irradiated onto a surface of a specimen while changing the rotation amount of the limiting aperture 17.

Fifth Embodiment

Figure 7:
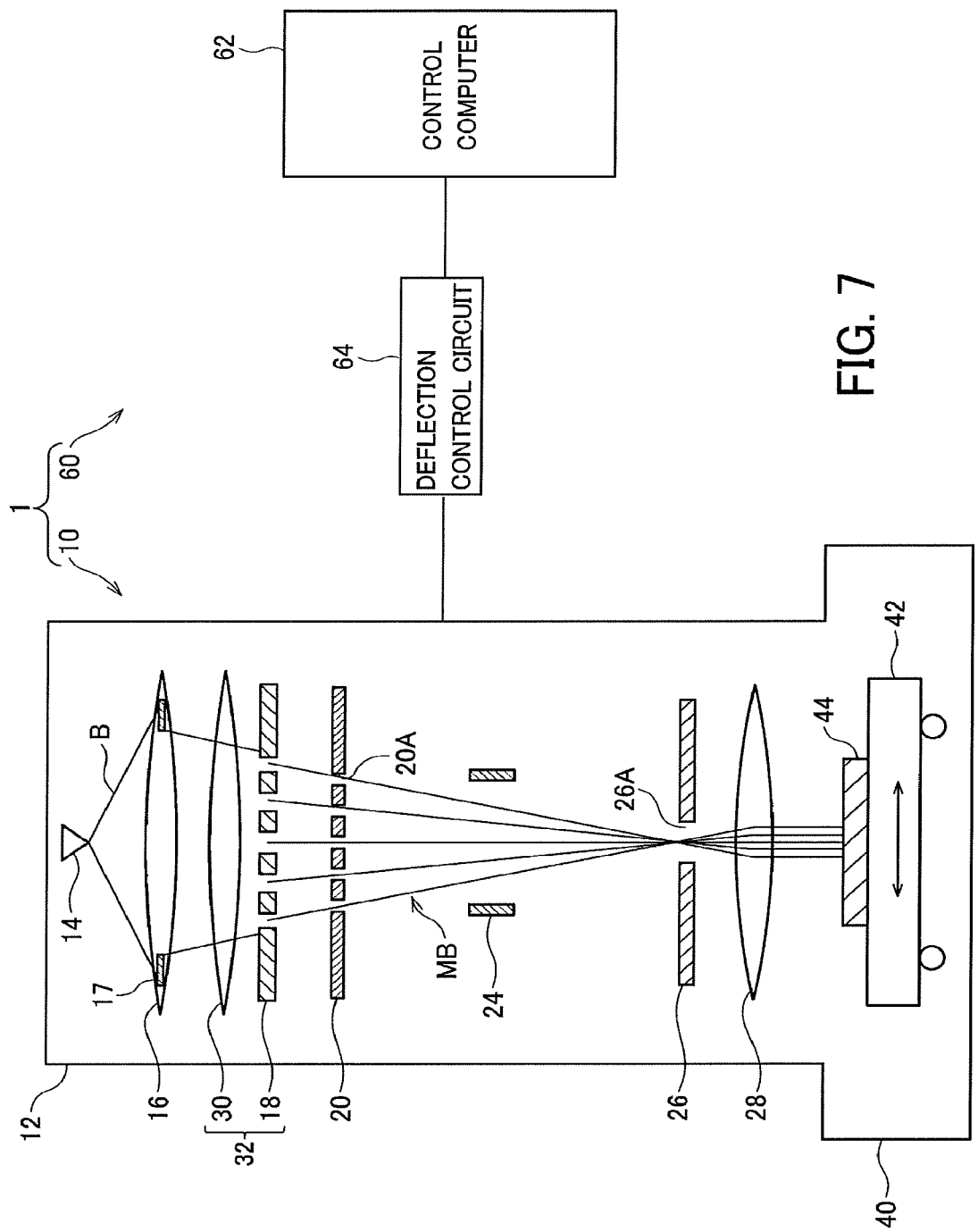
FIG. 7 is a schematic view of a multi-charged-particle beam writing apparatus according to a fifth embodiment of the present invention.

FIG. 7 illustrates a general constitution of a writing apparatus according to a fifth embodiment. The present embodiment is different, compared with the second embodiment illustrated in FIG. 4, in that the projection lens 22 is omitted, and each beam of the multi-beams MB travels toward the aperture 26A of the stopping aperture 26 at an angle. In the limiting aperture 17, the aperture 17A that has a circular shape may be formed or the aperture 17B that has a rectangular shape may be formed. In FIG. 7, portions identical to those in the second embodiment illustrated in FIG. 4 are given identical reference signs, and description thereof will be omitted.

The beam diameter of the whole multi-beams MB gradually decreases after passage through the limiting aperture 17. Moreover, the beam pitch of the multi-beams MB gradually decreases after passage through the shaping aperture array 18.

The multi-beams MB pass through the blanking aperture array 20 at a pitch that is narrower than a beam pitch that is formed by the shaping aperture array 18.

In the aforementioned first to fourth embodiments, the size of the aperture 17A, 17B formed in the limiting aperture 17 is almost the same as the size of the beam irradiation region 50, 50B in the shaping aperture array 18; however, in the present embodiment, the size of the apertures 17A, 17B is larger than the size of the beam irradiation region 50, 50B.

Even when the multi-beams MB travel toward the stopping aperture 26 while narrowing the beam pitch, the limiting aperture 17 reduces the beam irradiation amount with respect to the shaping aperture array 18, and it is possible to suppress the thermal expansion of the shaping aperture array 18.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A multi-charged-particle beam writing apparatus comprising:
    an emission unit emitting a charged-particle beam;
    a limiting aperture substrate including a single first aperture;
    a shaping aperture array member that has a plurality of second apertures and that is irradiated with the charged-particle beam having passed through the first aperture in a region including the plurality of second apertures and forms multi-beams by letting part of the charged-particle beam pass through the plurality of second apertures; and
    a blanking aperture array member including a plurality of third apertures through each of which a corresponding one of the multi-beams that have passed through the plurality of second apertures passes, the blanking aperture array member having a blanker in each of the third apertures, the blanker performing blanking deflection on the corresponding beam,
    wherein when an imaging magnification of an image of the plurality of second apertures on a surface of a substrate for writing is represented by M, a beam convergence angle is represented by $\alpha$, and an array pitch of the second apertures of the shaping aperture array member is represented by P, a gap D between the limiting aperture substrate and the shaping aperture array member satisfies $D \leq P/(10 \cdot M \cdot \alpha)$.

2. The apparatus according to claim 1, further comprising:
    an illumination lens arranged on an upstream side of the shaping aperture array member in an optical path,
    wherein the limiting aperture substrate is arranged between the illumination lens and the shaping aperture array member.

3. The apparatus according to claim 2, further comprising:
    an electrostatic lens arranged between the illumination lens and the shaping aperture array member,
    wherein the limiting aperture substrate is arranged in the illumination lens or on an upstream side of the illumination lens in an optical path.

4. The apparatus according to claim 1, wherein a shape of the first aperture is circular.

5. The apparatus according to claim 1, wherein a shape of the first aperture and a shape of an arrangement region of the plurality of second apertures are rectangular.

6. The apparatus according to claim 5, further comprising:
    a magnetic-field-type illumination lens arranged on an upstream side of the shaping aperture array member in an optical path; and
    a rotation mechanism that rotates the limiting aperture substrate.

7. The apparatus according to claim 1, wherein an array pitch of the third apertures is narrower than an array pitch of the second apertures.

* * * * *